(12) United States Patent
Shin et al.

(10) Patent No.: US 7,671,420 B2
(45) Date of Patent: Mar. 2, 2010

(54) SEMICONDUCTOR DEVICES HAVING FACETED CHANNELS AND METHODS OF FABRICATING SUCH DEVICES

(75) Inventors: Dong-Suk Shin, Suwon-si (KR); Ueno Tetsuji, Suwon-si (KR); Seung-Hwan Lee, Suwon-si (KR); Ho Lee, ChunAnn (KR); Hwa-Sung Rhee, SungNam (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 708 days.

(21) Appl. No.: 11/281,599

(22) Filed: Nov. 18, 2005

(65) Prior Publication Data

US 2006/0148154 A1 Jul. 6, 2006

(30) Foreign Application Priority Data

Jan. 4, 2005 (KR) .................. 10-2005-0000584

(51) Int. Cl.
*H01L 29/76* (2006.01)
*H01L 27/148* (2006.01)
*H01L 27/01* (2006.01)

(52) U.S. Cl. .................. 257/369; 257/255; 257/350; 257/627

(58) Field of Classification Search .................. 257/255, 257/270, 286, 287, 350, 351, 369, 371, 627, 257/628, E29.004, E21.442, E27.064
See application file for complete search history.

(56) References Cited

U.S. PATENT DOCUMENTS

| | | | |
|---|---|---|---|
| 6,475,890 | B1 | 11/2002 | Yu |
| 6,645,797 | B1 | 11/2003 | Buynoski |
| 6,673,667 | B2 | 1/2004 | Gorrell et al. |

2003/0190791 A1 10/2003 Fischetti (Continued)

FOREIGN PATENT DOCUMENTS

EP 1 555 688 7/2005

(Continued)

OTHER PUBLICATIONS

Q. Xiang et al., "Sidewall Faceting and Inter-facet Mass Transport in Selectively Grown Epitaxial Layers on SiO2-masked Si(1 1 0) Substrates." *J. of Crystal Growth*, vol. 175-176, No. 3001, May 1997, pp. 469-472.

(Continued)

*Primary Examiner*—Hung Vu
(74) *Attorney, Agent, or Firm*—Harness, Dickey & Pierce, P.L.C.

(57) ABSTRACT

Disclosed are processes and techniques for fabricating semiconductor substrates for the manufacture of semiconductor devices, particularly CMOS devices, that include selectively formed, high quality single crystal or monocrystalline surface regions exhibiting different crystal orientations. At least one of the surface regions will incorporate at least one faceted epitaxial semiconductor structure having surfaces that exhibit a crystal orientation different than the semiconductor region on which the faceted epitaxial semiconductor structure is formed. According, the crystal orientation in the channel regions of the NMOS and/or PMOS devices may be configured to improve the relative performance of at least one of the devices and allow corresponding redesign of the semiconductor devices fabricated using such a process.

17 Claims, 17 Drawing Sheets

U.S. PATENT DOCUMENTS

| | | |
|---|---|---|
| 2003/0209782 A1 | 11/2003 | Noble et al. |
| 2003/0227036 A1 | 12/2003 | Sugiyama |
| 2004/0161886 A1 | 8/2004 | Forbes et al. |
| 2004/0195646 A1 | 10/2004 | Yeo et al. |

FOREIGN PATENT DOCUMENTS

| | | |
|---|---|---|
| JP | 2002-359293 | 12/2002 |
| JP | 2003-243667 | 8/2003 |
| JP | 2003-332414 | 11/2003 |
| KR | 1020020095911 | 12/2002 |
| KR | 1020030095252 | 12/2003 |
| KR | 10-2004-0094779 | 11/2004 |
| WO | WO 97/16854 | 5/1997 |
| WO | WO 03/003470 | 1/2003 |

OTHER PUBLICATIONS

L. Chang et al., "CMOS Circuit Performance Enhancement by Surface Orientation Optimization." *IEEE Transactions on Electron Devices*, vol. 51, No. 10, Oct. 2004, pp. 1621-1627.

Xusheng Wu et al., "Impact of Non-vertical Sidewall on Sub-50nm FinFET." *IEEE International SOI Conference Proceedings*, Sep. 29, 2003, pp. 151-152.

M. Yang et al., "High Performance CMOS Fabricated on Hybrid Substrate With Different Crystal Orientations." *IEEE*, 2003.

NMOS

PMOS

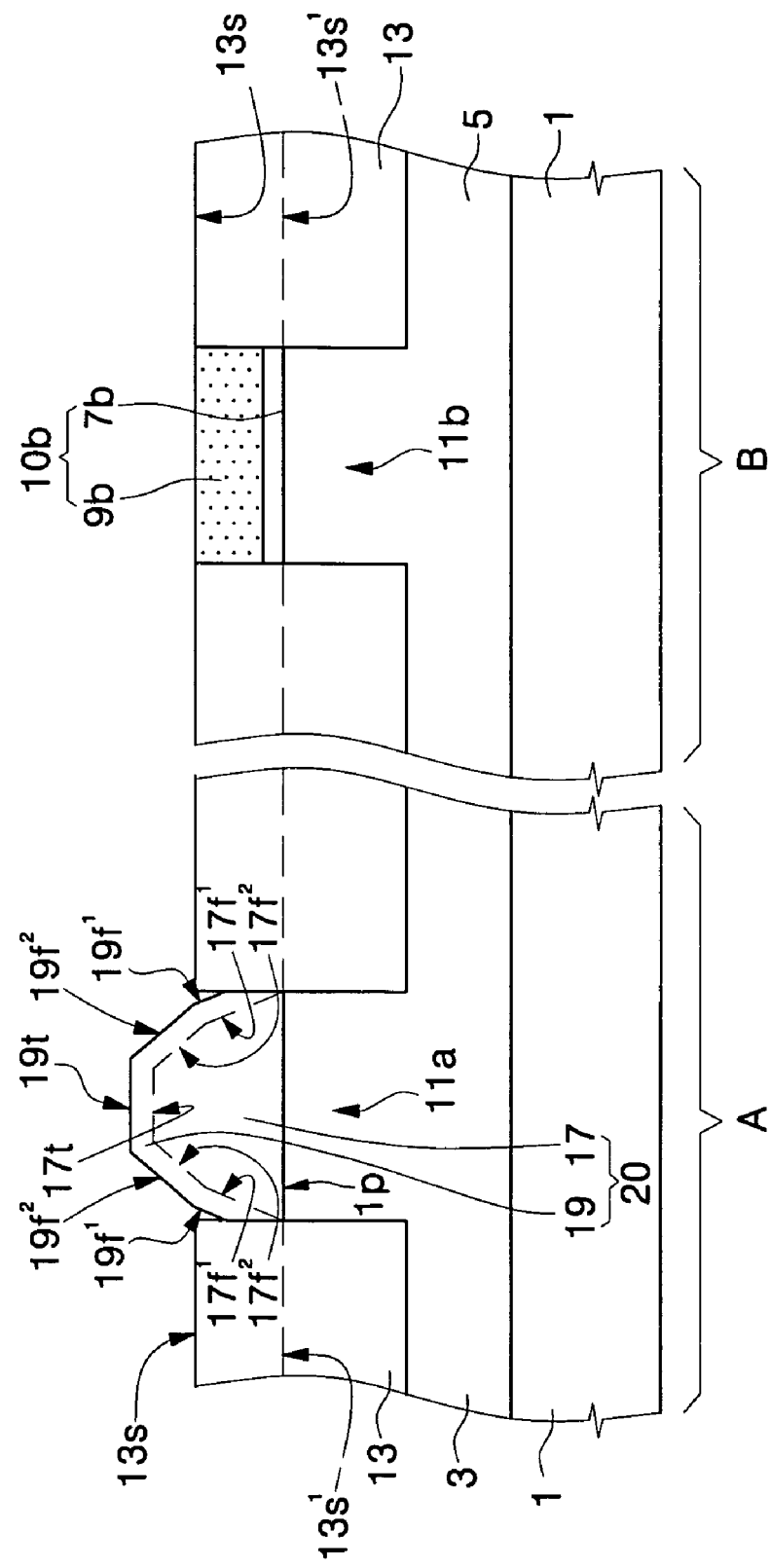

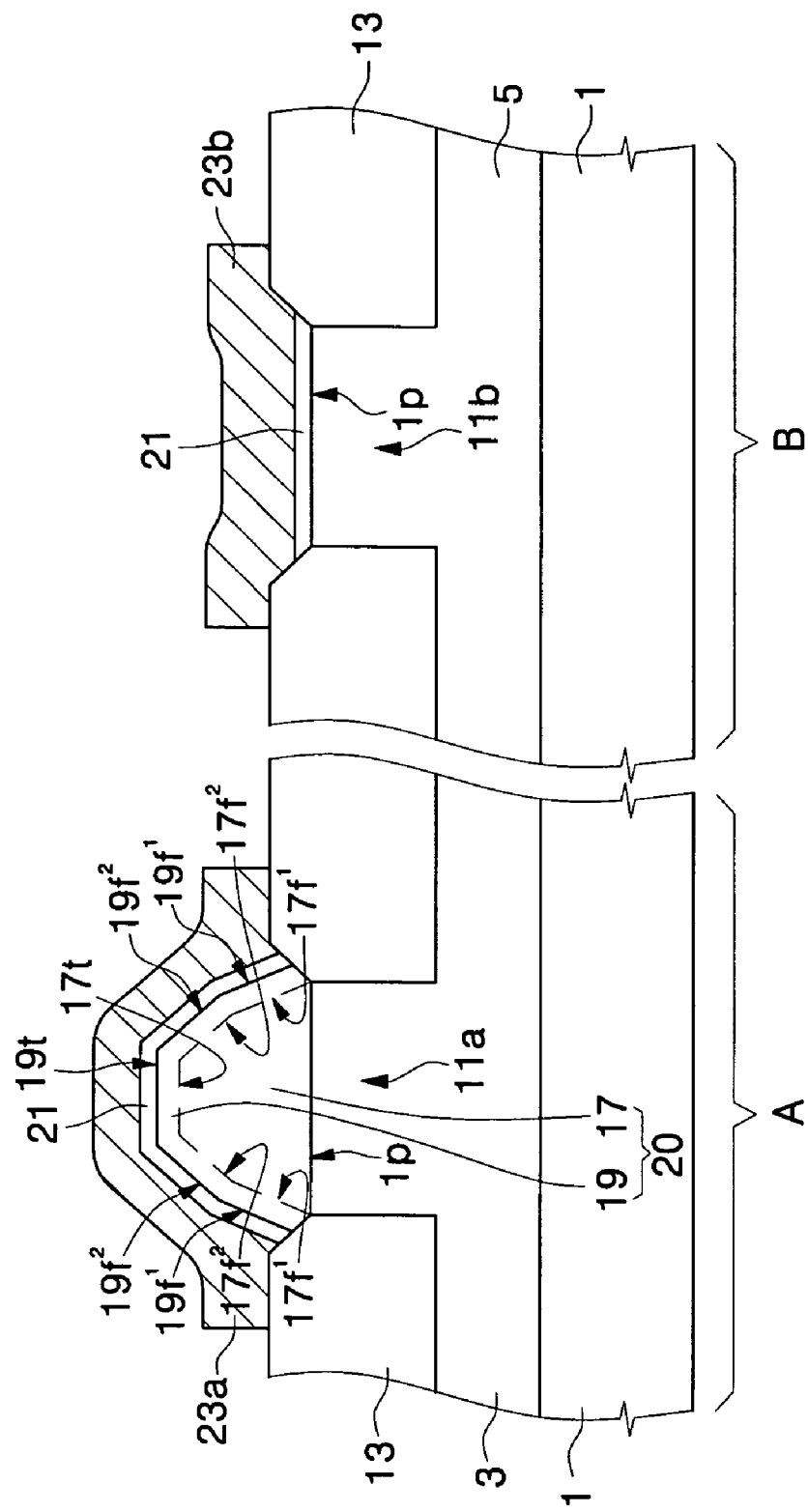

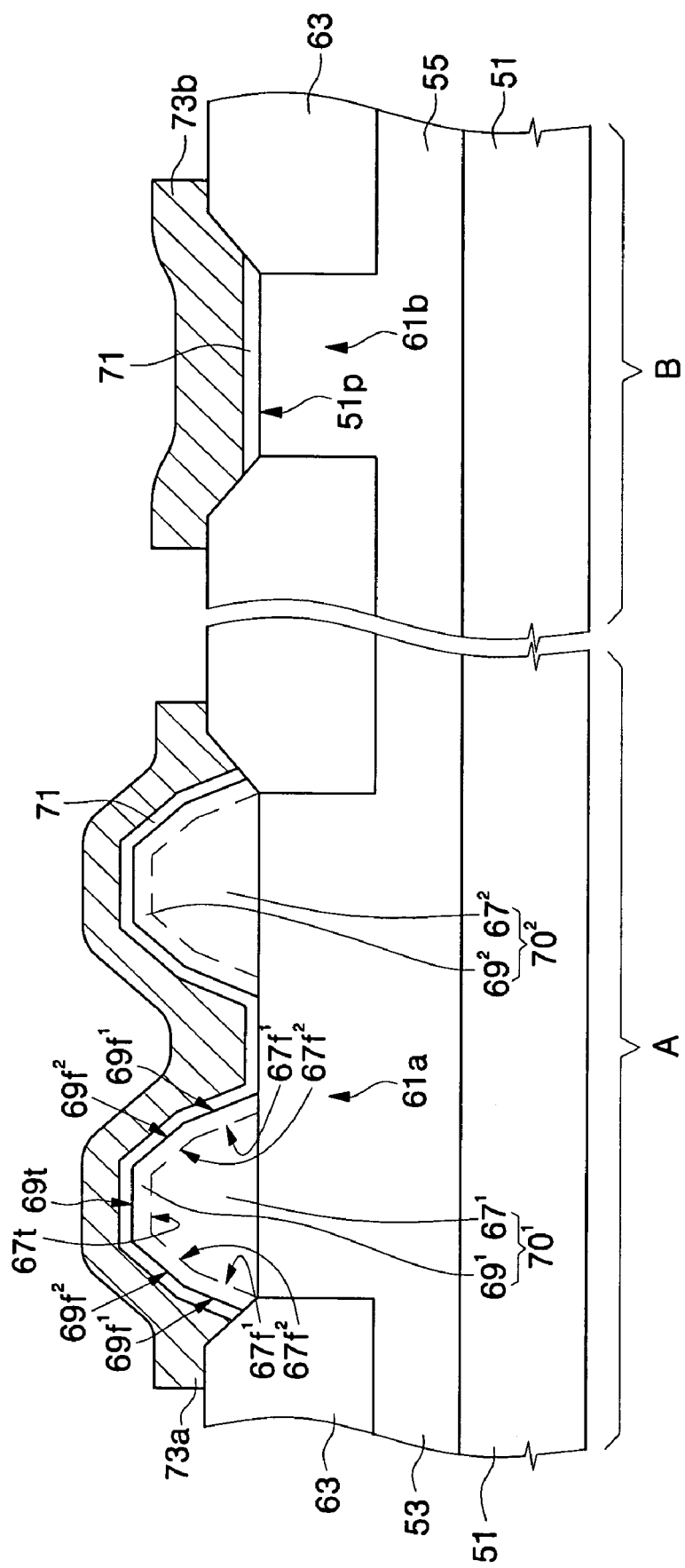

US 7,671,420 B2

SEMICONDUCTOR DEVICES HAVING FACETED CHANNELS AND METHODS OF FABRICATING SUCH DEVICES

PRIORITY STATEMENT

This U.S. non-provisional application claims benefit of priority under 35 U.S.C. § 119 from Korean Patent Application No. 2005-0000584, which was filed on Jan. 4, 2005, the entire contents of which are incorporated herein by reference.

BACKGROUND OF THE INVENTION

1. Field of the Invention

This invention relates generally to metal-oxide-silicon (MOS) semiconductor structures and devices and methods for fabricating such devices, and more specifically to semiconductor structures and devices having a complementary metal-oxide-silicon (CMOS) construction wherein the n-channel metal-oxide-silicon (NMOS) and p-channel metal-oxide-silicon (PMOS) devices are provided with channel regions having different crystal plane orientations for enhancing the relative performance of the NMOS and/or the PMOS devices and methods for fabricating such channel regions on a single semiconductor substrate.

2. Background Art

Semiconductor devices are fabricated from multiple layers of conducting, insulating, and semiconducting material layers and patterns. With respect to single crystal semiconductor materials in particular, the properties of such layers depend in part on the crystal orientation of the exposed surfaces into which dopants are implanted and/or additional patterns are formed.

In general, the most commonly utilized crystal orientation for silicon wafers used in VLSI (Very Large Scale Integration) device fabrication processes is the (100) crystal orientation. The semiconductor manufacturing industry has tended to adopt the (100) surface orientation over the (111) crystal orientation in part to take advantage of the lower surface state density on thermally oxidized surfaces associated with the (100) surface. For example, a surface having a (111) crystal orientation may exhibit a surface state charge density of approximately $5 \times 10^{11}$ e/cm$^2$, while a corresponding surface having a (100) crystal orientation may exhibit a surface state charge density of approximately $9 \times 10^{10}$ e/cm$^2$, a reduction of about 80%. Similarly, surfaces having a (110) crystal orientation can exhibit a surface state charge density of approximately $2 \times 10^{11}$ e/cm$^2$, still approximately twice the surface charge density of corresponding (100) surfaces.

As will be appreciated by those skilled in the art, the lattice planes and directions relation to a particular crystalline structure are commonly expressed using Miller indices, i.e., a grouping of three numbers h, k and l that are set off by additional surrounding characters for indicating a specific direction, i.e., [1,−1,0], a family of equivalent directions, i.e., <110>, a specific plane, i.e., (110), or a family of equivalent planes, i.e., {110}. This notation may be utilized with various crystal unit cells including simple cubic (SC), body-centered cubic (BCC), face-centered cubic (FCC) and diamond (DIA or C) which may be considered a modified FCC. Silicon and germanium, for example, are typically considered to have a diamond crystalline structure.

Surface state density can be a particularly important consideration for NMOS technologies as a result of the difficulties associated with higher surface state density levels for accurately controlling the active and parasitic device threshold voltages for devices fabricated on such surfaces. As semiconductor device fabrication methods and device design have improved, the differences in surface state densities have become somewhat less problematic. For example, the difference in surface state density levels between surfaces having (100) and (110) crystal orientations may translate a voltage offset of about 0.1 volts in the active device threshold voltage. Offsets of this magnitude may be and are routinely compensated through the use of a surface threshold voltage ion implant. Another benefit for NMOS devices formed on surfaces having lower surface state charge densities flows from improved electron mobility in inversion layers formed on surfaces having a (100) crystal orientation when compared with surfaces.

As illustrated in FIGS. 1A and 1B, electron and hole mobility can vary widely with the orientation of the channel region surface and the direction of the carrier flow within that channel region. As reflected in the relative mobility values illustrated in FIGS. 1A and 1B, a particular combination of crystal orientation and carrier direction that improves hole mobility tends to suppress electron mobility simultaneously. As a result, while electron mobility is higher on (100) substrates, particularly with current flow in the <110> direction, hole mobility is highest on (110) substrates with current flow in the <110> direction. The relative mobility of the corresponding carriers, in turn, affects the sizing and/or performance of the resulting semiconductor devices and tends compromise the performance of either the NMOS or the PMOS devices when the devices are formed in semiconductor regions having the same crystal orientation.

Semiconductor surfaces having a (110) crystal plane orientation have been investigated, particularly in the context of Silicon On Insulator (SOI) technologies, by using (110) substrate wafers and/or by inducing recrystallization of the surface of a substrate wafer to produce regions having a (110) crystal orientation. These efforts, however, have required adaptation of the structures and processes that have been developed for the more standard (100) crystalline plane orientation and/or require difficult and/or costly additional processing steps and procedures.

Accordingly, there remains a need for substrate structures and fabrication methods that can improve carrier mobility in one or both of the NMOS and PMOS semiconductor devices and that achieve these improvements using processes that are generally compatible with conventional processing materials, techniques and methods and without necessitating unduly complex or costly additional processing steps.

BRIEF SUMMARY OF THE INVENTION

Processes and techniques according to embodiments of the invention provide semiconductor substrates for fabrication of semiconductor devices, particularly CMOS devices, that include selectively formed, high quality monocrystalline surface regions exhibiting different crystalline orientations.

Processes and techniques according to embodiments of the invention provide semiconductor devices in which the NMOS devices are fabricated in a first semiconductor region configured for improving the performance of a corresponding NMOS device fabricated in a second semiconductor region.

Processes and techniques according to embodiments of the invention provide semiconductor devices in which the PMOS devices are fabricated in the second semiconductor region configured for improving the performance of a corresponding PMOS device fabricated in the first semiconductor region Processes and techniques according to embodiments of the invention provide semiconductor substrates on which the first or second semiconductor regions incorporate a projecting single crystal structure having facets having surfaces exhibiting at least one crystal orientation not expressed or exposed in the other semiconductor region.

Processes and techniques according to embodiments of the invention provide semiconductor substrates on which the first or second semiconductor regions incorporate a plurality of projecting single crystal structures having facets having surfaces exhibiting at least one crystal orientation not expressed or exposed in the other semiconductor region.

Processes and techniques according to embodiments of the invention may be used to fabricate a semiconductor device having a semiconductor substrate having a first active area and a second active area. The first active area includes a first primary semiconductor surface having a first crystal orientation, a gate dielectric layer formed on the first primary surface, and a gate electrode formed on the gate dielectric layer. Similarly, the second active area includes a second primary semiconductor surface having the first crystal orientation, a faceted epitaxial semiconductor structure grown from the second primary semiconductor surface having at least one facet surface that has a second crystal orientation, a gate dielectric formed on the facet surfaces, and a gate electrode formed on the gate dielectric.

Semiconductor devices as described above may be configured whereby the faceted epitaxial semiconductor structure has a first pair of facet surfaces that have the second crystal orientation and a second pair of facet surfaces that have a third crystal orientation. The faceted epitaxial semiconductor structure may also include a top surface having the first crystal orientation arranged between a pair of facet surfaces that form obtuse angles with the top surface and exhibit a second crystal orientation.

The faceted epitaxial semiconductor structure may be fabricated to include a core material and a surface layer in which the core material exhibits a first lattice constant $L_C$ and the surface layer exhibits a second lattice constant $L_S$. In some embodiments, these first and second lattice constants may satisfy the expression $L_C > L_S$. Furthermore, the core material and surface layer may be selected from a group consisting of Si, SiC, SiGe and Ge and configured so that the first and second lattice constants satisfy the expression $L_C < L_S$.

The substrate on which the semiconductor device is formed may be configured whereby the first crystal orientation is (110), a PMOS device is formed on the first active area and a NMOS device is formed on the second active area. The faceted epitaxial semiconductor structure provided on such a substrate may include a first pair of facet surfaces that have a crystal orientation of (100).

Alternatively, the substrate on which the semiconductor device is formed may be configured whereby the first crystal orientation is (100), a NMOS device is formed on the first active area and a PMOS device is formed on the second active area. The faceted epitaxial semiconductor structure provided on such as substrate may include a first pair of facet surfaces have a crystal orientation of (110).

Further still, the substrate on which the semiconductor device is formed may be configured whereby two faceted epitaxial semiconductor structures are formed on the second primary semiconductor surface, each of the faceted epitaxial semiconductor structures including at least two facet surfaces that have a second crystal orientation. This pair of faceted epitaxial semiconductor structures may be separated and arranged in a parallel orientation or may be arranged to provide some rotational offset between the longitudinal axes of the faceted epitaxial semiconductor structures.

Whether the semiconductor device includes one or more faceted epitaxial semiconductor structures are formed in a single active region, the subsequent processing may be similar whereby gate dielectric layers may be formed on the facet surfaces of the faceted epitaxial semiconductor structures after which a gate electrode may be formed on the gate dielectric layers.

Another method for forming a semiconductor device in accord with an embodiment of the invention will include forming a first active area having a first primary semiconductor surface and a second active area having a second primary semiconductor surface wherein both the first and second primary semiconductor surfaces having a first crystal orientation. A faceted epitaxial semiconductor structure having a least two facet surfaces exhibiting a second crystal orientation may then be formed on one of the primary semiconductor surfaces. Gate dielectric layers may then be formed on the first primary semiconductor surface and the facet surfaces, and gate electrodes formed on the gate dielectric layers.

The faceted epitaxial semiconductor structures fabricated in accord with the invention may be of varying complexity, including embodiments in which the faceted epitaxial semiconductor structures are formed with a first pair of facet surfaces exhibiting the second crystal orientation and a second pair of facet surfaces exhibiting a third crystal orientation. Similarly, the faceted epitaxial semiconductor structure may be formed with a first pair of facet surfaces exhibiting the second crystal orientation and a top surface having the first crystal orientation arranged or extending between a pair of facet surfaces that form obtuse angles with the top surface.

As suggested above, the faceted epitaxial semiconductor structures may be fabricated by forming a core material and forming a surface layer on the core material. The core material may be selected or fabricated to exhibit a first lattice constant $L_C$, while the surface layer may be selected or fabricated to exhibit a second lattice constant $L_S$, whereby the first and second lattice constants will satisfy the expression $L_C > L_S$. Alternatively, the materials may be selected or fabricated whereby the first and second lattice constants will satisfy the expression $L_C < L_S$. Both the core and surface layer materials may be selected from a group of semiconducting materials consisting of Si, SiC, SiGe and Ge.

Other suitable semiconducting materials, including binary, tertiary and even quaternary materials representing combinations of elements selected from one or more of the II, III, IV, V and VI columns of the periodic table may be suitable for some applications and the particular combination of elements and/or the relative stoichiometric ratios of the same basic combination of elements may vary between the core material and the surface layer material. As will be appreciated by those skilled in the art, the use of heterogeneous semiconducting materials fabricated from atoms having different atomic radii can also be used to form "strained" layers resulting from a crystal lattice mismatch between successive material layers in which the upper layer is in tension or compression. Incorporating one or more strained layers into the basic semiconductor structures utilized in practicing various embodiments of the invention may provide an additional technique for adjusting the relative performance of the NMOS and PMOS transistors.

As will be appreciated by those skilled in the art, the semiconductor device according to the invention may incorporate a region having a first crystal orientation of (110) with the PMOS devices formed on the first active area and the NMOS devices formed on the second active area. The faceted epitaxial semiconductor structures may be fabricated to exhibit a first pair of facet surfaces having a crystal orientation of (100).

Conversely, the semiconductor device according to the invention may incorporate a region having a first crystal orientation of (100) with the NMOS devices formed on the first active area and the PMOS devices formed on the second active area and faceted epitaxial semiconductor structures fabricated to exhibit a first pair of facet surfaces having a crystal orientation of (110).

As will be appreciated by those skilled in the art, the semiconductor device according to the invention may incorporate a region having first and second faceted epitaxial semiconductor structures arranged in a parallel orientation on the second primary semiconductor surface, each of the first and second faceted epitaxial semiconductor structures includes least two facet surfaces. Gate dielectric layers may then be formed on the facet surfaces of the first and second faceted epitaxial semiconductor structures one or more gate electrodes may be formed on the gate dielectric layers.

BRIEF DESCRIPTION OF THE DRAWINGS

The invention will become more apparent by describing in detail exemplary embodiments thereof with reference to the attached drawings in which:

FIGS. 7A-7E illustrate cross-sections corresponding to certain process steps in the fabrication of semiconductor devices according to an embodiment of the invention;

FIGS. 9A-9C illustrate cross-sections corresponding to certain process steps in the fabrication of semiconductor devices according to an embodiment of the invention including a plurality of faceted structures in a single active region.

Figure 1A:
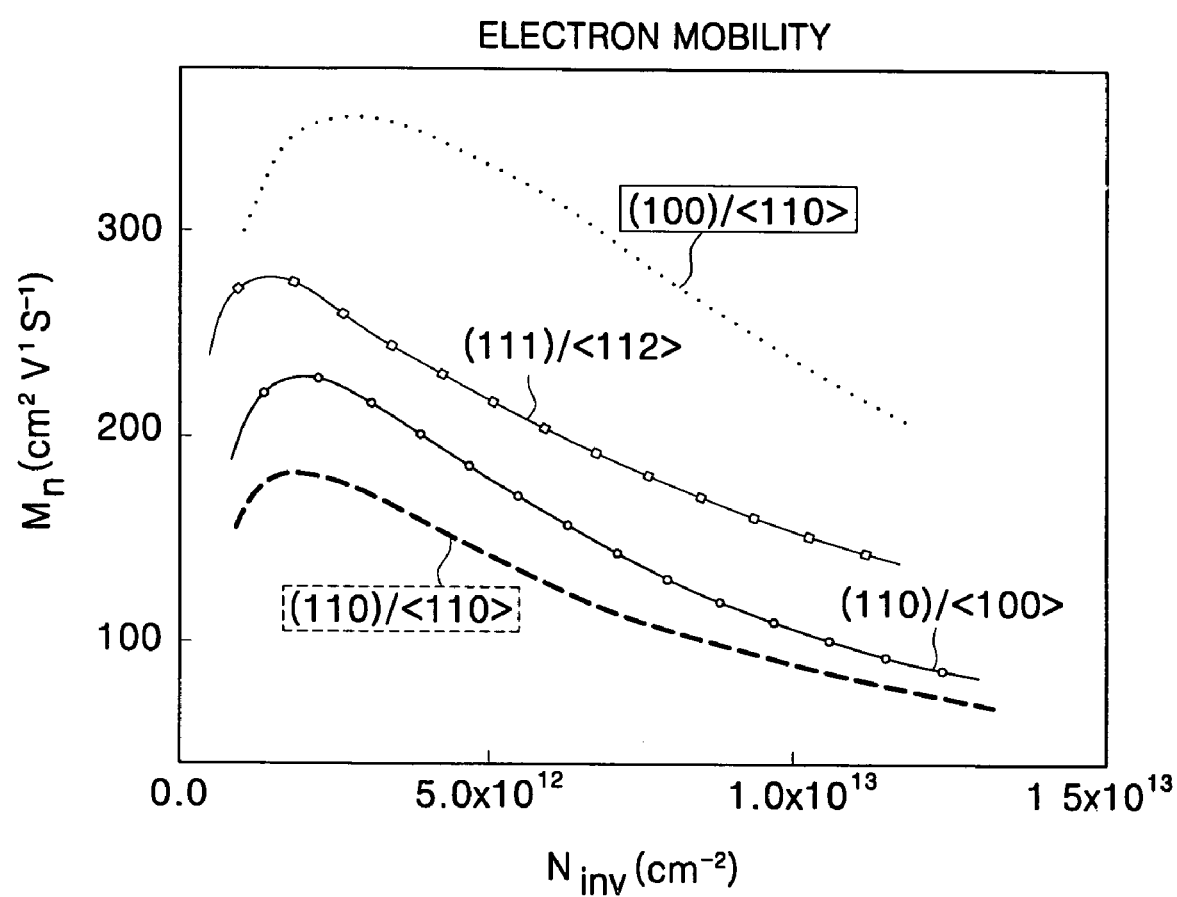
FIGS. 1A and 1B illustrate the mobility of electrons and holes through substrates having different crystal orientations and/or different current directions.

These drawings have been provided to assist in the understanding of the exemplary embodiments of the invention as described in more detail below and should not be construed as unduly limiting the invention. In particular, the relative spacing, positioning, sizing and dimensions of the various elements illustrated in the drawings are not drawn to scale and may have been exaggerated, reduced or otherwise modified for the purpose of improved clarity.

Those of ordinary skill in the art will also appreciate that a range of alternative configurations have been omitted simply to improve the clarity and reduce the number of drawings. Those of ordinary skill will appreciate that certain of the various process steps illustrated or described with respect to the exemplary embodiments may be selectively and independently combined to create other methods useful for manufacturing semiconductor devices without departing from the scope and spirit of this disclosure.

DETAILED DESCRIPTION OF EXAMPLE EMBODIMENTS

Figure 1B:
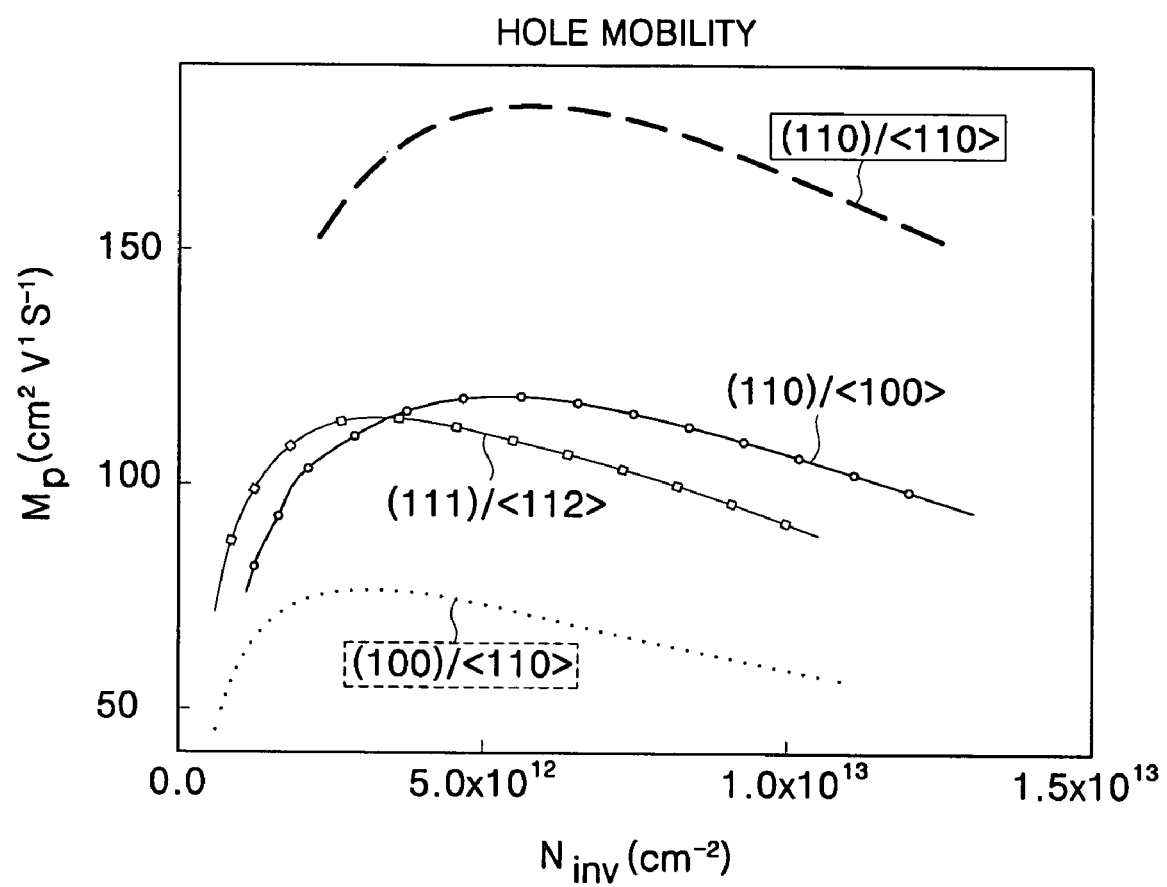

As illustrated in FIGS. 1A and 1B, the mobility of electrons and holes, i.e., the carriers for the respective NMOS and PMOS devices used to construct semiconductor devices, particularly CMOS devices, depends on the crystal orientation, the current flow direction and the carrier concentration. As also illustrated in FIGS. 1A and 1B, the combinations of crystal orientation and current flow direction that tend to enhance the mobility of one type of carrier tends to suppress or degrade the mobility of the other type of carrier. For example, while electron mobility is highest on a substrate exhibiting a (100) crystal orientation, hole mobility is highest on a substrate exhibiting a (110) crystal orientation. Similarly, even within a single crystal orientation the actual direction of current flow will affect the carrier mobility. For example, hole mobility in a substrate exhibiting a (110) crystal orientation will be higher in the <110> direction than in the <100> direction.

Because the carrier mobility in the inversion layers of the respective NMOS and PMOS devices will directly affect the performance of the final semiconductor device, fabricating semiconductor devices using only a single crystal orientation necessarily degrades or compromises the overall performance of the device. These degrading effects can be mitigated to some degree by adjusting the structure of the affected devices by, for example, increasing the relative channel width to provide increased current flow. However, the need for an asymmetrical design for the NMOS and PMOS devices fabricated on a single substrate complicates device design and decreases the degree of integration that can be achieved.

Figure 2A:
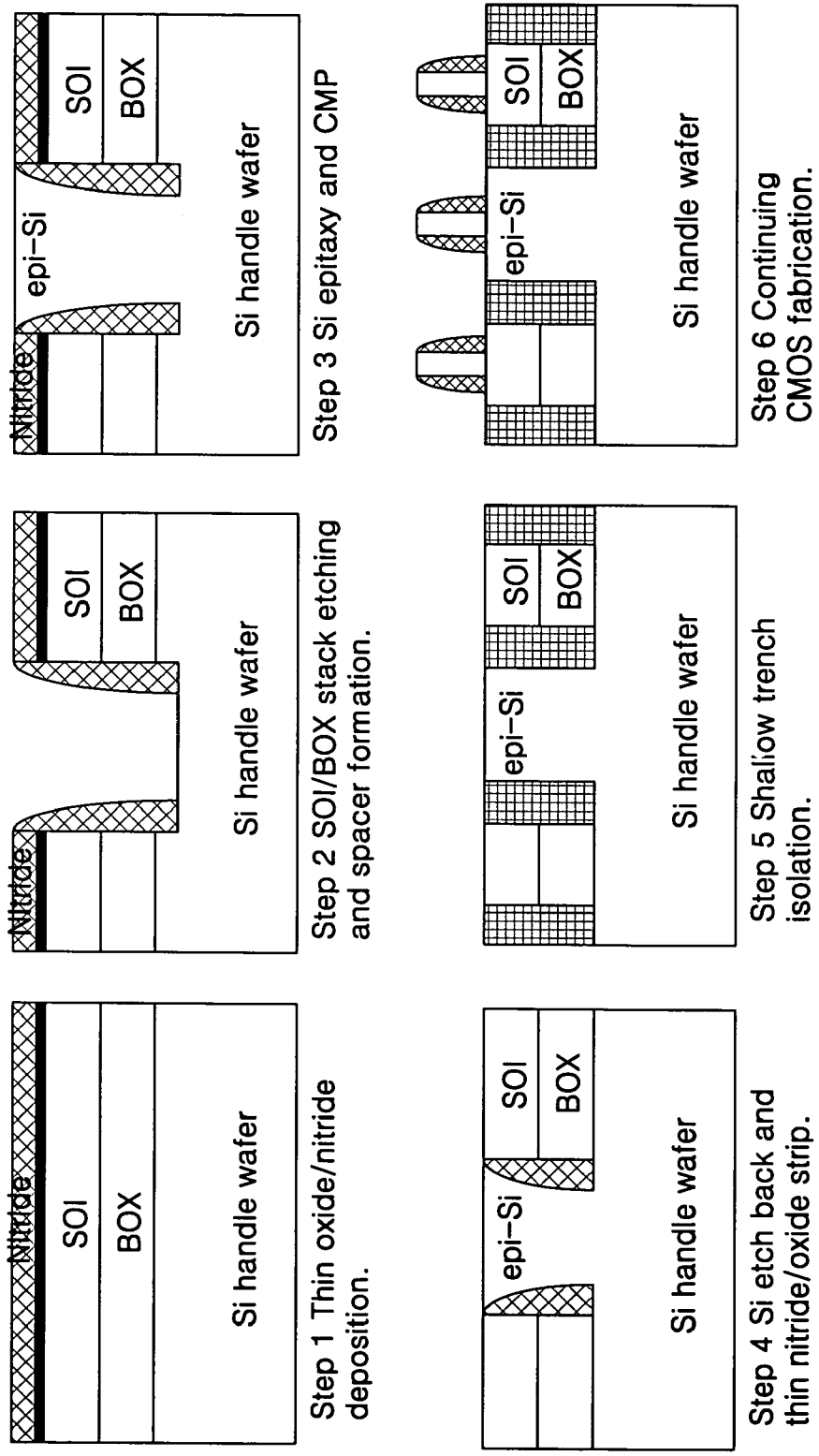
FIG. 2A illustrates a conventional SOI process incorporating a selective epitaxial growth (SEG) process that can be used to fabricate the part of semiconductor device illustrated in FIG. 2B.

As noted above, efforts have been made to prepare hybrid semiconductor substrates having regions exhibiting different crystal orientations. Certain of the processing steps for preparing such substrates are illustrated in FIG. 2A. As reflected in FIG. 2A, the fabrication begins with a silicon handle wafer having a first crystal orientation on which is formed a buried oxide layer (BOX). A silicon on insulator (SOI) layer is then formed on the BOX layer with the SOI layer having a crystal orientation different from that of the handle wafer.

A masking pattern of another material, for example silicon nitride, may then be formed on the SOI layer and, along with the SOI layer and the BOX layer, etched to expose surface regions of the handle wafer. An epitaxial process may then be used to fill the opening created with single crystal semiconductor material and produce a substrate having a substantially planar surface exhibiting regions having different crystal orientations separated by shallow trench isolation (STI) dielectric regions.

Figure 2B:
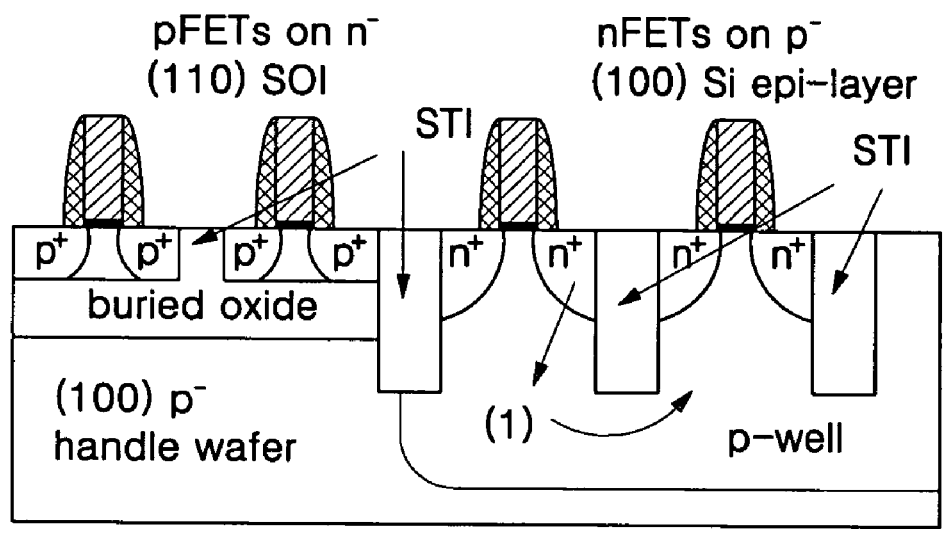
Figure 2B:
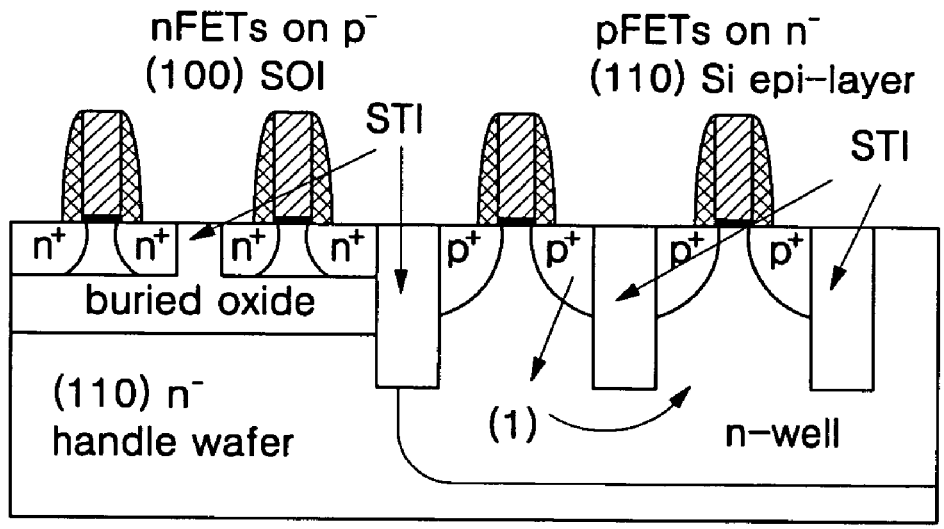

As will be appreciated by those skilled in the art, the relative crystal orientations and doping levels in the exposed SOI and bulk surfaces will determine their relative suitability for the fabrication of NMOS and PMOS transistors as reflected in FIG. 2B. For example, when the handle or bulk wafer has a (100) crystal orientation and a p-doping level, the NMOS devices will be formed in the epitaxial material grown from the exposed surfaces of the bulk or handle wafer and the PMOS devices will be formed in the SOI regions that have a (110) crystal orientation and an n-doping level.

In accord with an embodiment of the invention, NMOS devices may be formed on a surface or active region exhibiting a surface having a (100) crystal orientation and PMOS devices may be formed on a surface of active region exhibiting a surface having a (110) crystal orientation formed through a combination of wafer bonding (SOI) and selective epitaxial growth (SEG) techniques. Once the differently oriented active regions are defined, the NMOS and PMOS devices that will, in combination, comprise the semiconductor device, may be formed on the appropriately configured substrate regions, thereby better matching the carriers with beneficially and differently oriented crystal surfaces.

Figure 3A:
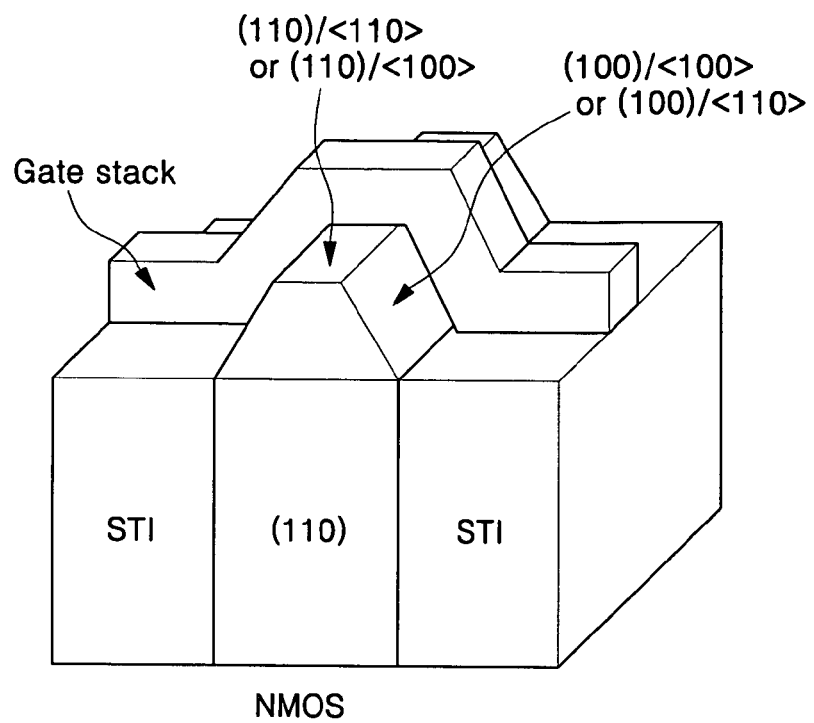
FIGS. 3A and 3B illustrate a NMOS transistor and a PMOS transistor, respectively, fabricated in accord with an embodiment of the invention.
Figure 3B:
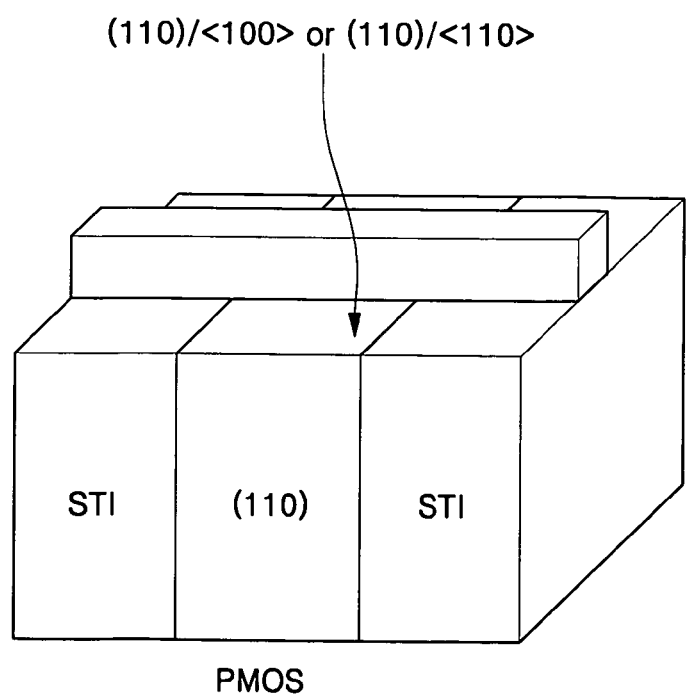

As illustrated in FIGS. 3A and 3B, a semiconductor device fabricated in accord with this invention will include both NMOS and PMOS devices fabricated on single crystal semiconductor materials exhibiting dissimilar crystal orientations. As reflected in FIG. 3A, the NMOS device may be formed on a region of a bulk wafer having a (110) crystal orientation on which is formed a faceted epitaxial semiconductor structure that includes facet surfaces exhibiting a more preferred crystal orientation, for example (100). Depending on the relative configuration of the transistor, the current flow through the NMOS device may be directed in more than one direction, for example a <100> direction or a <110> direction, thereby providing another level of control for the carrier mobility in semiconductor devices fabricated according to an embodiment of the invention.

Conversely, as reflected in FIG. 3B, the corresponding PMOS device may be formed on a region of a bulk wafer having a (110) crystal orientation and on which no faceted epitaxial semiconductor structure have been formed. Again depending on the relative configuration of the transistor, the current flow through the PMOS device may be directed in more than one direction, for example a <100> direction or a <110> direction, thereby providing another level of control for the relative carrier mobility of electrons and holes in semiconductor devices fabricated according to an embodiment of the invention.

For the semiconductor device configuration illustrated in FIGS. 3A and 3B, a major portion of the NMOS channel length is formed on a (100) facet of epitaxial layer, thereby increasing the electron mobility above that which could be achieved in the bulk or handle wafer material. With respect to the corresponding PMOS device, by forming the transistor on (110) bulk substrate surface, a higher hole mobility is maintained as opposed to that which could be achieved on the (100) material exhibited on the facets. As a result, the overall performance of the resulting device may be improved and/or the integration density may be increased without sacrificing performance.

Figure 4:
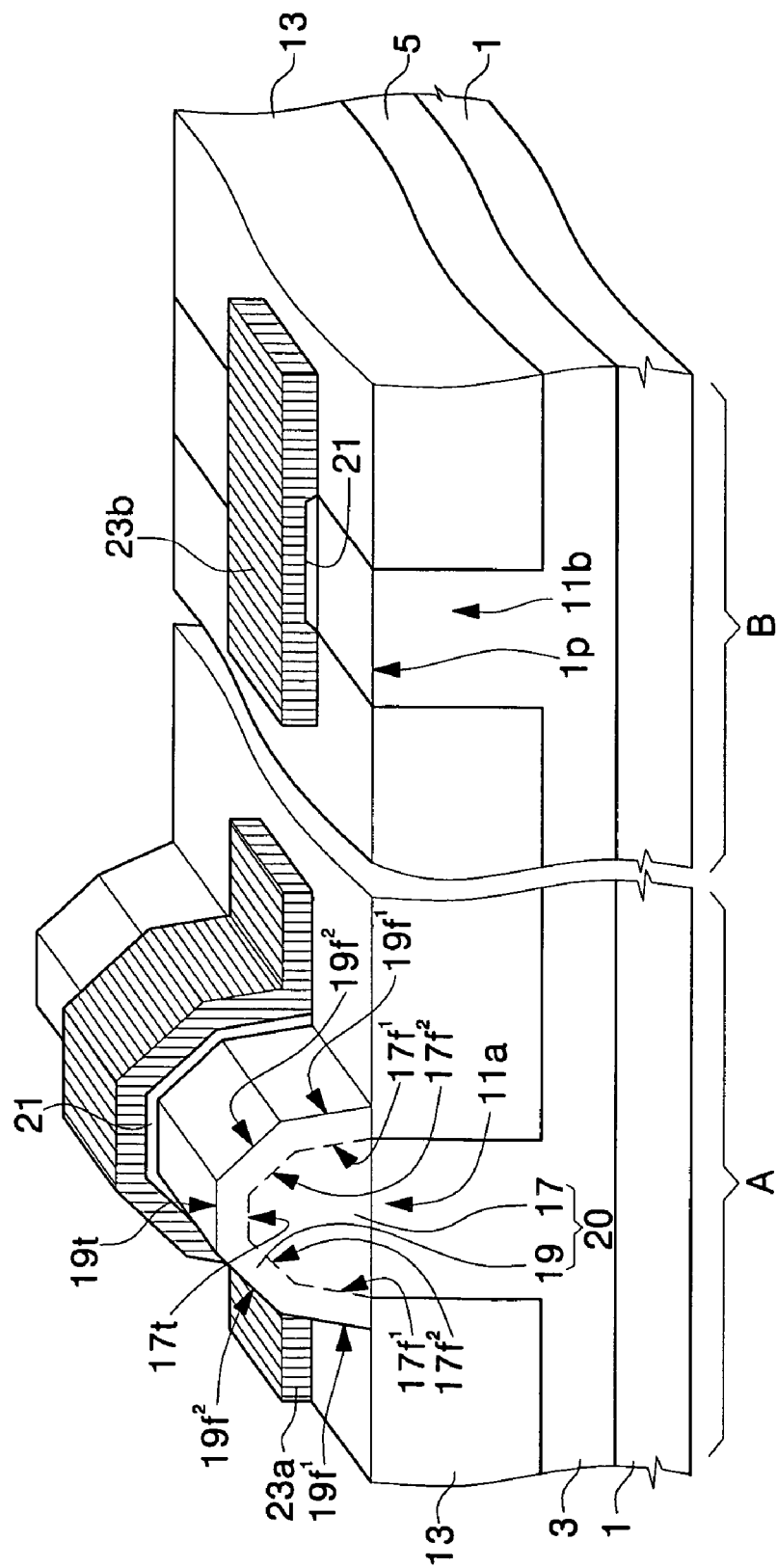
FIG. 4 illustrates both a first transistor and a second transistor, respectively, fabricated on semiconductor regions having different crystal orientations in accord with an embodiment of the invention.

Turning to an embodiment of the invention as illustrated in FIG. 4, the illustrated semiconductor device is formed on a semiconductor substrate 1 that is separated into a first transistor area A and a second transistor area B with insulating material 13, for example a STI layer, arranged between the corresponding transistor areas. The first and second transistor areas A, B also include a first conductivity type well 3 and a second conductivity type well 5. The surface of the substrate 1 exhibits a first crystal orientation $1p$ and will typically be formed from Si, SiGe, SiC and combinations thereof or other semiconductor materials having sufficiently similar crystal structures although, as indicated above, certain other semiconductor materials may be suitable for some applications. The first transistor area A includes a first active region $11a$ with the second transistor area B that includes a second active region $11b$.

As illustrated in FIG. 4, an epitaxial pattern 20 may be formed on the first active region $11a$ and may include both a core or first epitaxial layer or pattern 17 that is, in turn, covered with a surface layer or shell epitaxial layer 19. Both of the core and surface layers (or epitaxial patterns) 17, 19, may be fabricated using a selective epitaxial growth (SEG) process while largely limiting its effects to the portion of the substrate exposed in the first transistor area A. As shown in FIG. 4, the epitaxial pattern 20 may include a surface layer 19, a top facet $19t$, e.g., a facet that substantially parallels the surface of the base substrate, a first pair of facets $19f^1$ and a second pair of facets $19f^2$ that exhibit crystal orientations different than the crystal orientation of the semiconductor substrate $1p$. If present, the surface layer 19 will typically exhibit the same facet surface orientations as the core material 17, but may have a different lattice constant.

The epitaxial pattern 20 includes a faceted core material 17, with or without the optional surface layer 19, which includes a corresponding series of facets having a top surface $17t$, a pair of first facets $17f^1$ and a pair of second facets $17f^2$. A gate dielectric 21, for example, an oxide and/or another insulating material suitable for the subsequent fabrication steps and/or methods, is then formed over the channel structures. First and second gate electrodes $23a$, $23b$, may then be formed on the gate dielectric in order to control the performance and state of the transistor channels defined under the gate dielectric.

As will be appreciated by those skilled in the art, an embodiment of the basic structure according to the invention is illustrated in FIG. 4 may be configured in a manner wherein the NMOS devices are formed in the first transistor area A and the PMOS devices are formed in the second transistor area B. In such an instance, the orientation of the first and second conductivity type wells, $1p$, will be (110) with p- and n-doping levels. This configuration may be reversed whereby the PMOS devices are formed in the first transistor area A and the NMOS devices are formed in the second transistor area B. In such an instance, the orientation of the first and second conductivity type wells, $1p$, will be (100) with n- and p-doping levels respectively.

The epitaxial pattern 20 includes at least two facets that exhibit a different surface crystal orientation than the substrate $1p$ and may be formed from a single epitaxial semiconductor pattern 17 or from a plurality of patterns 17, 19 that may, in turn, be formulated or selected to provide a desired heterogeneous epitaxial semiconductor pattern. As used herein, the term heterogeneous epitaxial semiconductor pattern corresponds to an epitaxial pattern 20 in which the upper or surface epitaxial pattern 19 has the same surface crystal orientation as the lower or core epitaxial pattern 17 but has a different lattice constant.

A semiconductor device fabricated according to an embodiment of the invention incorporating a heterogeneous epitaxial semiconductor pattern 20 will tend to reflect a strained semiconductor layer 19. For example, selecting materials whereby the lattice constant for the lower or core epitaxial pattern 17, $LC_{core}$, and the upper or surface epitaxial pattern 19, $LC_{surface}$, satisfy the expression (1):

$$LC_{core} > LC_{surface} \quad (1)$$

thereby producing an upper epitaxial pattern 19 that is under tension, further increasing the electron mobility and improving NMOS performance. Such a result may be achieved with various pairings of materials including, for example, the core/surface configurations:

Si/sic,
SiGe/Si,
SiGe/SiC,
Ge/Si,

Ge/SiC, and

Ge/SiGe.

Conversely, the materials may be selected whereby the lattice constant for the lower or core epitaxial pattern 17 and the upper or surface epitaxial pattern 19, satisfy the expression (2):

$$LC_{core} < LC_{surface} \quad (2)$$

thereby producing an upper epitaxial pattern 19 that is under compression, further increasing the hole mobility and improving PMOS performance. Such a result may be achieved with various pairings of materials including, for example, the core/surface configurations:

SiC/Si,
Si/SiGe,
SiC/SiGe,
Si/Ge,
SiC/Ge, and
SiGe/Ge.

The facets produced on the epitaxial pattern 20 that incorporates a surface or upper layer 19, typically $19f^1$ and, optionally, $19f^2$, form an acute angle with the surface of the first active area 11a. As noted above, both the surface or upper epitaxial layer 19 the lower or core epitaxial layer 17 typically include a top surface 17t, 19t that exhibits the same surface crystal orientation as the corresponding substrate orientation 1p. The faceted epitaxial semiconductor structure also includes at least a first pair of facets $17f^1$, and possibly $19f^1$, that have a different surface crystal orientation that the corresponding substrate orientation 1p. The lower epitaxial layer 17 may also incorporate a faceted epitaxial semiconductor structure having a second pair of facets $17f^2$, and possible $19f^2$, having a surface crystal orientation that differs from both the substrate orientation and the first pair(s) of facets.

The sizing and configuration of one or more transistors will tend to determine the size of the top surface 17t, 19t, if any. Because improvements in the resulting transistors are function of the availability of channel regions having a crystal orientation that differs from that of the base substrate 1 a length ratio between the facet length and the top length included in the channel should be at least 1:1 and preferably 3:1, 5:1 or greater. Indeed, in some instances, it may be possible to eliminate a top surface from the faceted epitaxial semiconductor structure, leaving only facet surfaces for channel formation. As will be appreciated, the device performance will typically continue to improve as the length ratio between the facet length and the top length increased, reflecting greater portions of the channel being formed on facet surfaces.

The surface orientation of the facets depends on the surface orientation of the substrate 1p, on which the faceted epitaxial semiconductor structure is grown. If the substrate 1 has a surface that exhibits a (100) crystal orientation, then it is preferable that one of $17f^1$ and $17f^2$ (and $19f^1$ and $19f^2$, if present) has a (110) surface crystal orientation. Conversely, if the substrate exhibits a (110) oriented surface, then it is preferable that one of $17f^1$ and $17f^2$ (and $19f^1$ and $19f^2$, if present) has an (100) surface crystal orientation.

Figure 5A:
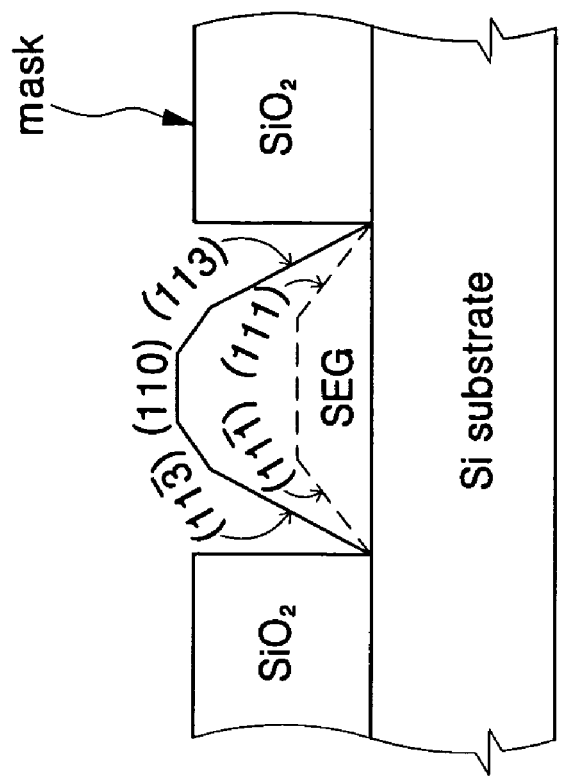
FIGS. 5A and 5B illustrate two alternative constructions for the faceted semiconductor regions and the corresponding crystalline orientation information that can be fabricated and utilized according to an embodiment of the invention.
Figure 5A:
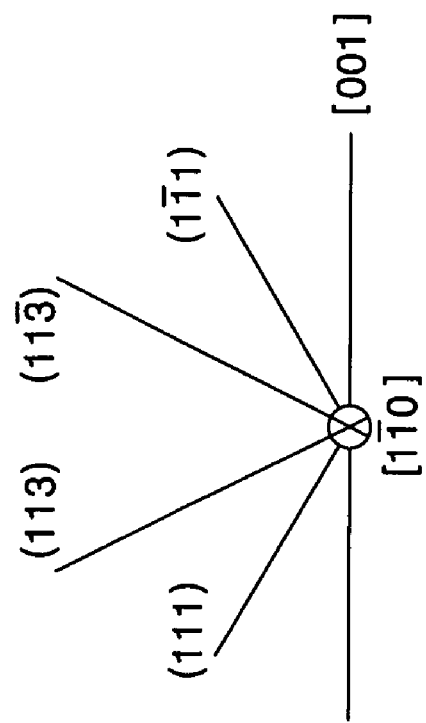
Figure 5B:
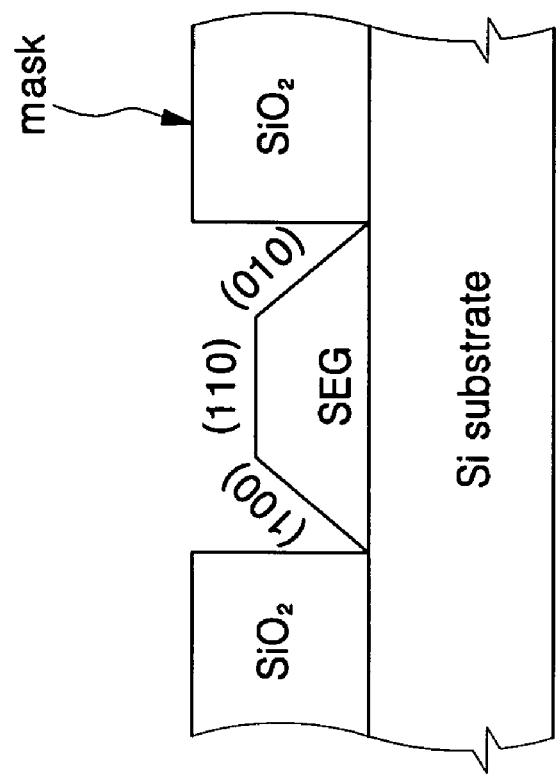
Figure 5B:
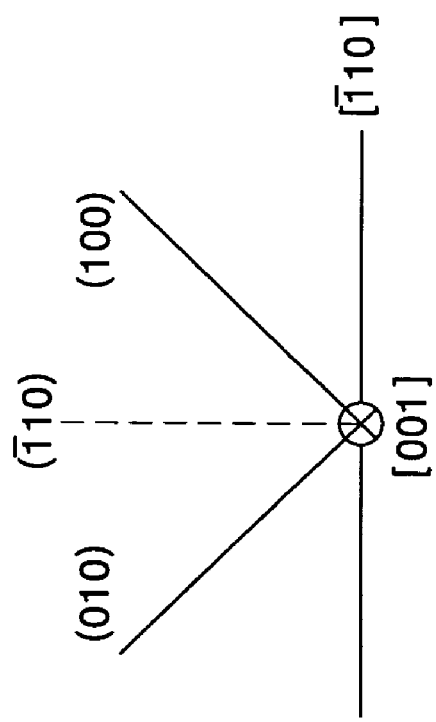
Figure 6A:
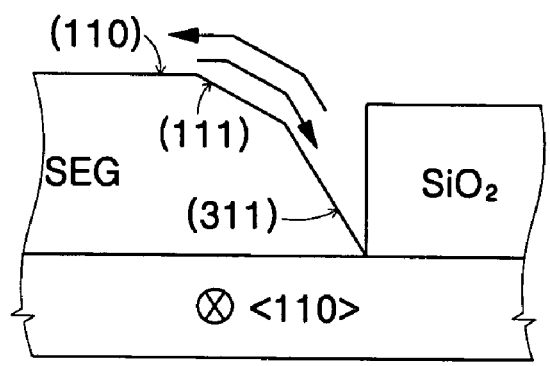
FIGS. 6A and 6B illustrate two alternative constructions for the faceted semiconductor regions that can be fabricated and utilized according to an embodiment of the invention.
Figure 6B:
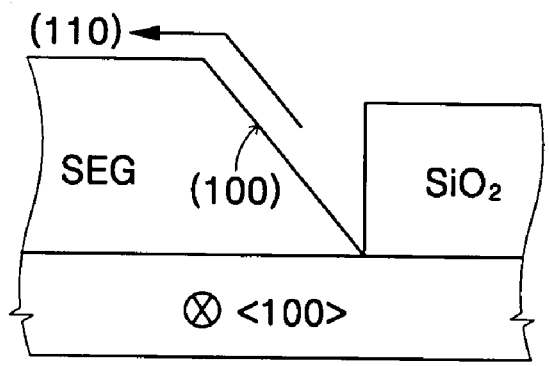

As will be appreciated by those skilled in the art, the facets produced may, as illustrated, be generally symmetrical about a central vertical longitudinal plane bisecting the gate structure(s). In such an instance, the surface crystal orientation of the opposing facets will be of similar size and extent and will have surface crystal orientations that differ only in the reversed sign of at least one intercept in the crystallographic expression, e.g., as illustrated in FIG. 5A, or in the reversed intercepts of two of the three axes, e.g., as illustrated in FIG. 5B. Conversely, the surrounding structures or configuration of the initial surface may be selected or prepared in a manner that produces an asymmetrical structure, e.g., one in which the "mirroring" facet is absent, of a different size and/or expresses a crystalline structure that does not "mirror", i.e., is not in the same family of planes {h,l,k} as, the opposite facet surface.

First Example Embodiment

Figure 7A:
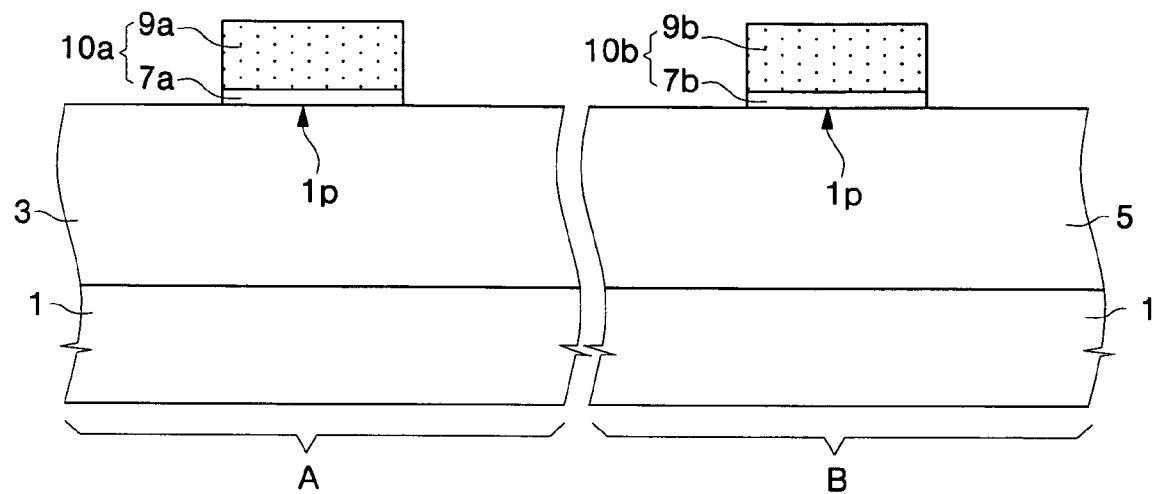

A fabrication process according to an embodiment of the invention is illustrated in FIGS. 7A-7E and is described in more detail below. As illustrated in FIG. 7A, a first well 3 is formed in first transistor area A and a second well 5 is formed in second transistor area B in the base substrate 1 that exhibits a first surface crystal orientation 1p. As noted above, the substrate 1 may be selected from a number of materials including, for example, Si, SiGe and SiC, suitable for forming single crystal semiconductor substrates. A first isolation pattern 10a and a second isolation pattern 10b are then formed on the first and second wells 3, 5 respectively. The isolation patterns may be formed from a stack of pad silicon oxide 7a, 7b and a pad silicon nitride 9a, 9b that were patterned and etched using a suitable photolithographic process.

Figure 7B:
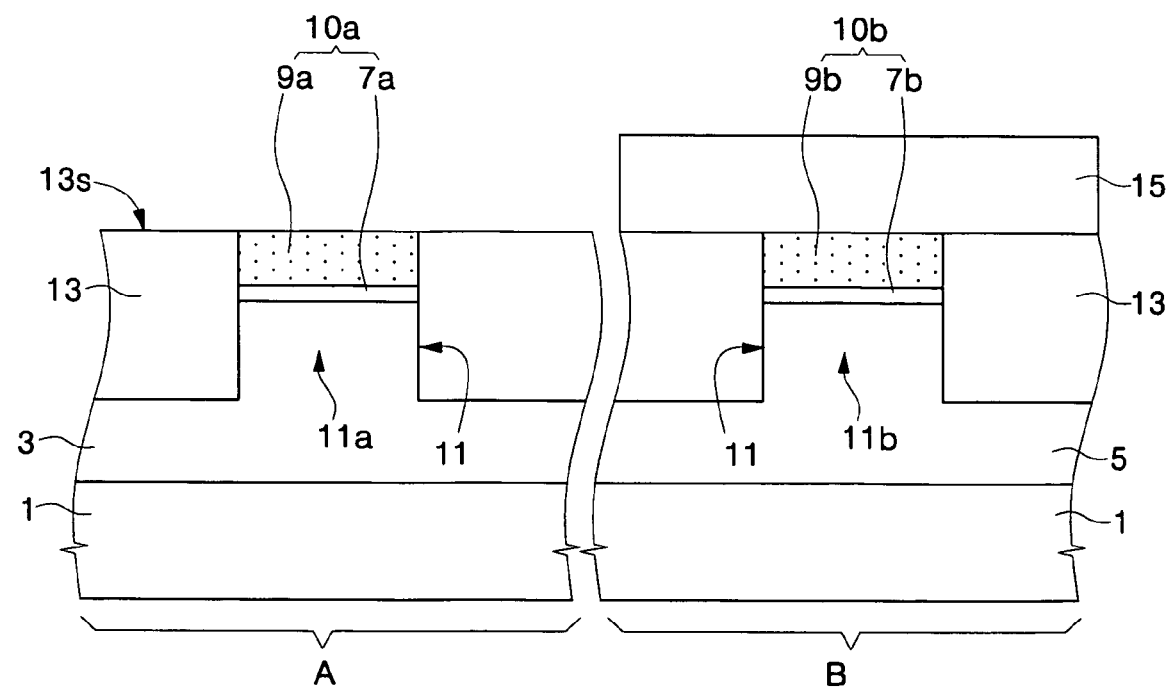

The substrate 1 is then etched using the isolation patterns 10a, 10b to form trenches that separate and define a first active area 11a and a second active area 11b. The trenches are then filled with an insulating material, for example silicon oxide, and the upper portion of the insulating material is removed by, for example, a chemical mechanical polishing (CMP) process to expose the upper surface of the isolation patterns and thereby form the shallow trench isolation layers 13 to obtain the structure suggested in FIG. 7B. As illustrated in FIG. 7B, a photoresist pattern 15 is then formed to shield the second transistor area B and the isolation pattern in the first transistor area A is removed to expose a portion of the surface of the substrate 1.

As illustrated in FIG. 7C, the first isolation pattern 10a is removed from the first transistor area A and the photoresist pattern 15 is removed from the second transistor area B. During the formation of the faceted epitaxial semiconductor structure, it is generally preferable to inhibit or suppress lateral growth of the epitaxial pattern from the exposed semiconductor surface. The epitaxial pattern that grows on the surface of the shallow trench isolation layer 13 will typically have either a polycrystalline structure or an amorphous structure.

The choice of processing conditions and the duration of any etch processes will determine the extent to which the surface of the shallow trench isolation layer 13 could be recessed (for example from 13s to the $13s^1$). Once the surface is substantially free of organic matter, the epitaxial pattern 20 may be grown on the exposed semiconductor surface in the first transistor area A. The epitaxial pattern 20 will include facets having a different surface crystal orientation than that of the substrate surface 1p from which it extends.

As discussed in some detail above, the epitaxial pattern 20 may constitute only a single epitaxial semiconductor pattern 17 or, in the alternative, may constitute a heterogeneous epitaxial semiconductor pattern that includes both a core pattern 17 and a surface pattern 19. As also discussed above, depending on the selection of the materials used to form the core and surface patterns 17, 19 the upper or surface epitaxial layer 19 can be configured as a strained semiconductor layer under either tension or compression for further altering the mobility of carriers within the channel region.

Each of the facets formed on the epitaxial pattern 20 are arranged at an acute angle relative to the surfaces of the first and second active areas 11a, 11b. Further, as discussed above, in light of the performance advantages provided by the facet surfaces, it is generally preferable to increase the relative length of the facets over the length of the top surface (if any) that will simply reflect the crystal orientation of the substrate 1p. The range of surface orientations that may be reflected in or exhibited by the facets depends on the surface orientation 1p of the original or base substrate 1 and the crystalline structure of the semiconductor material, but will generally be limited to a fairly small group of crystal orientations including, for example, the (111), (113), (110), (100) and (010) crystal orientations as well as the corresponding "mirror" orientations that will be expressed in the exposed surface of corresponding facet surfaces in more symmetrical structures, for example, ($\bar{1}$11), ($\bar{1}$13), (11$\bar{3}$), (1$\bar{1}$0) and (010).

Figure 7D:
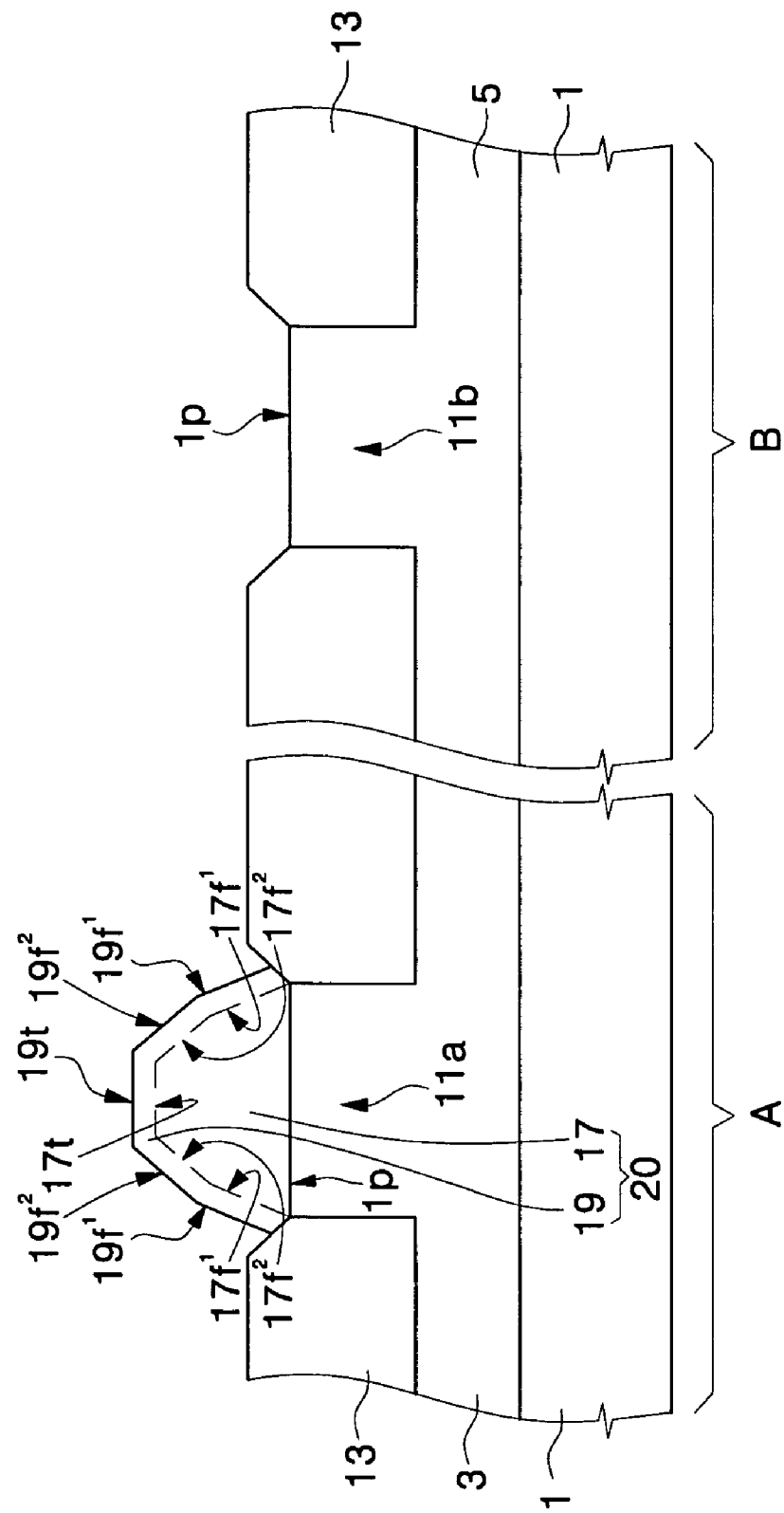

As illustrated in FIG. 7D, the second isolation pattern 10b is then removed to expose the surface of the active area in the second transistor area B. As illustrated in FIG. 7E, a gate dielectric 21 is then formed on the exposed semiconductor surfaces of the second active area as well as the exposed surfaces of the faceted epitaxial semiconductor structure. A gate electrode stack layer 23 is then formed over the gate dielectric 21 in the first and second active areas 11a, 11b, patterned and etched to form a first gate pattern 23a and a second gate pattern 23b respectively. Additional processing including, for example, source/drain regions ion implantation, metallization, testing and packaging, will typically be performed to complete the semiconductor fabrication process and produce a useful semiconductor device.

Second Example Embodiment

Figure 8:
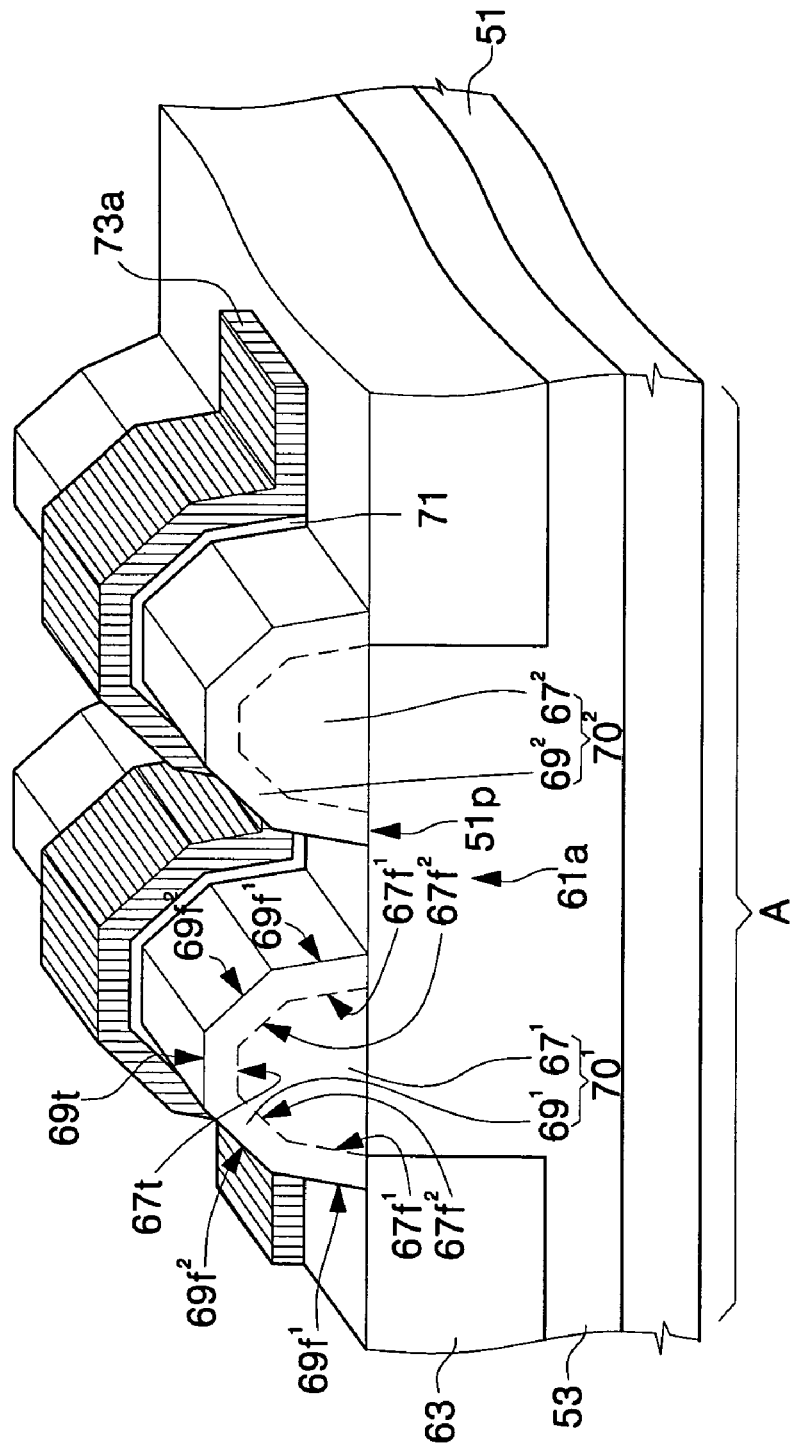
FIG. 8 illustrates an embodiment according to the invention in which a plurality of faceted structures are incorporated in a single active region.

An active area of a semiconductor device according to another example embodiment of the invention is illustrated in FIG. 8 in which a plurality of epitaxial patterns 70$^1$, 70$^2$ are formed in a single active area 61a. As illustrated in FIG. 8, the epitaxial patterns may generally be arranged in a parallel configuration, but the patterns may also be arranged in other configurations, e.g., perpendicular or at some other angular offset (not shown) in some instances. The multiple epitaxial patterns will serve to increase the effective surface area of the active area 61a in which the patterns are formed and thereby improve current drivability.

Figure 9A:
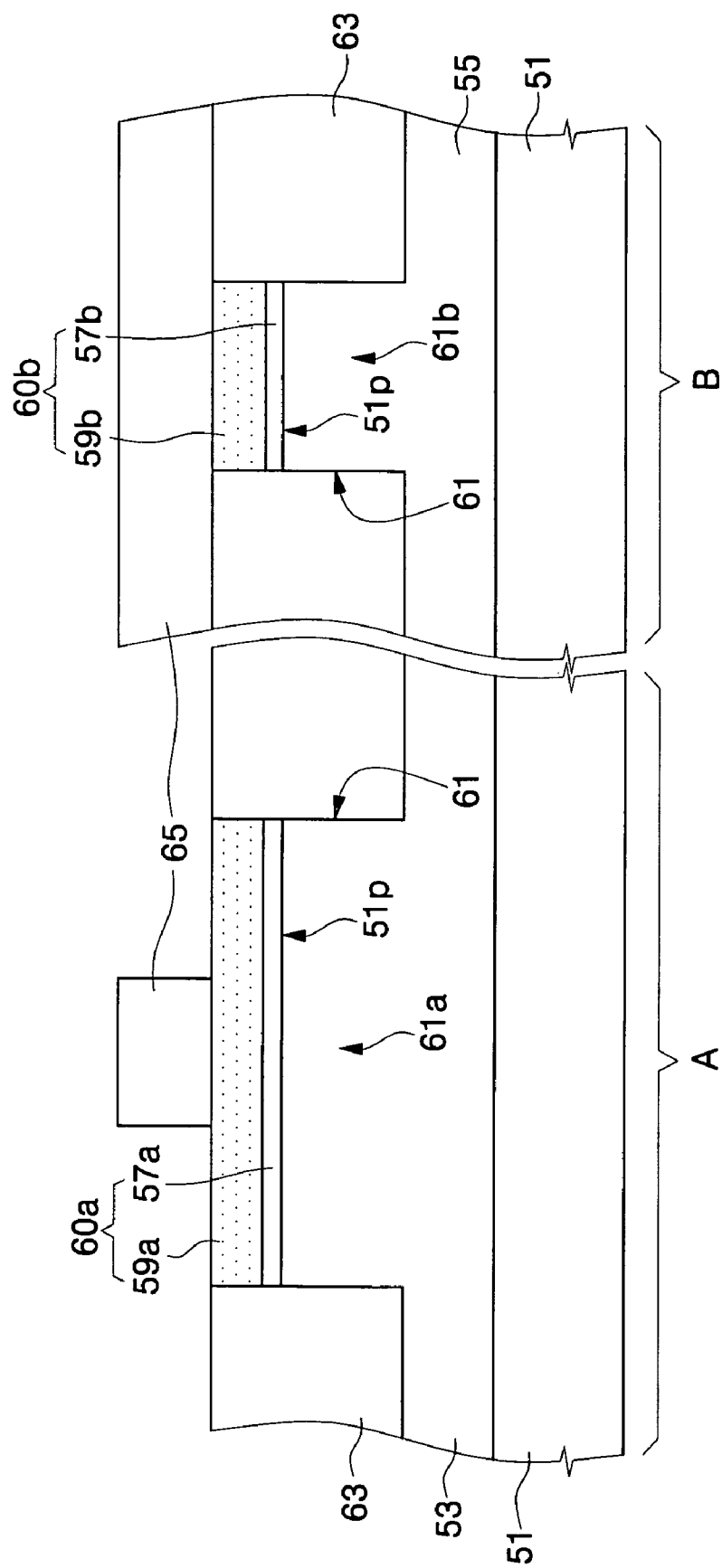
Figure 9B:
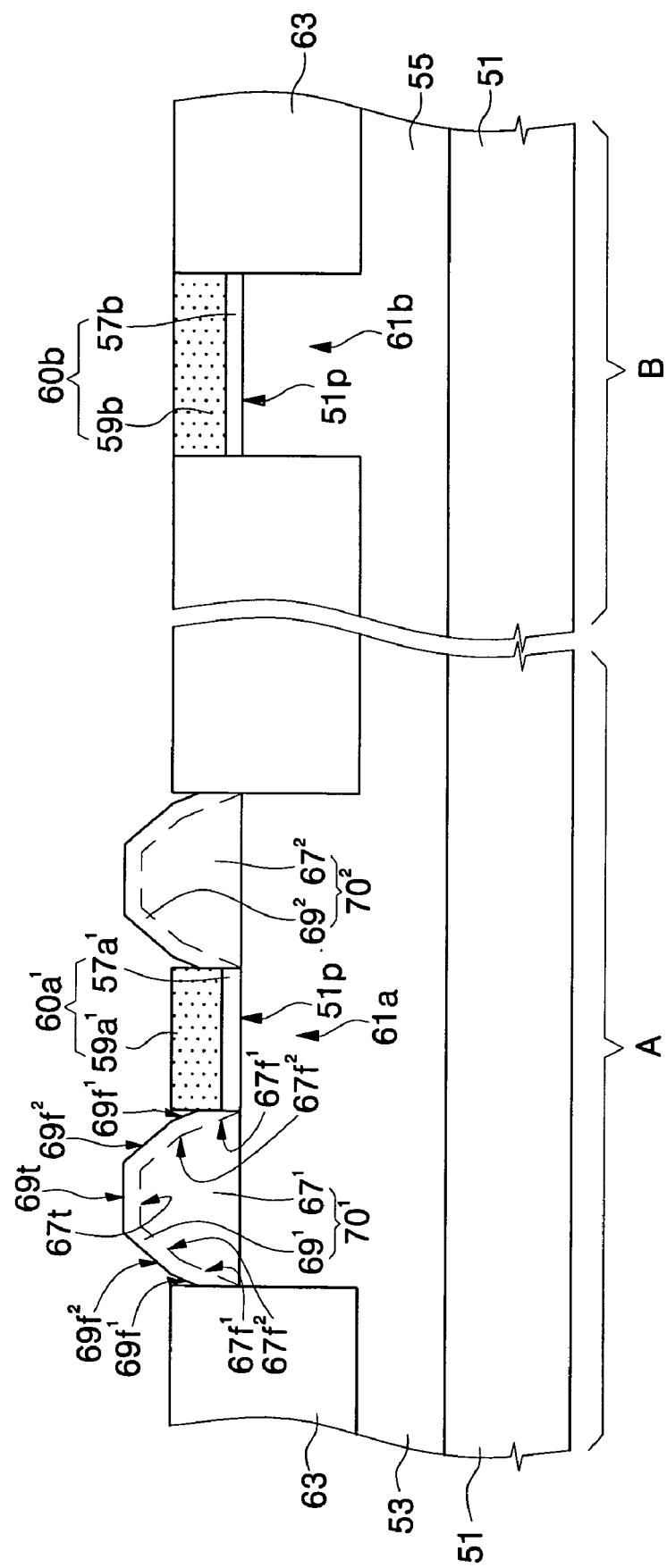

As illustrated in FIGS. 9A-9C, the second example embodiment may be manufactured using a process similar to that utilized for fabricating the first example embodiment. As illustrated in FIG. 9A, a first well 53 is formed in the first transistor area A and a second well 55 is formed in the second transistor area B in a base substrate 51. A first isolation pattern 60a, a second isolation pattern 60b and shallow trench isolation layers 63 are then formed on the first and second wells 53, 55. Portions of the first isolation pattern 60a are then removed to expose a plurality of semiconductor surface regions within the first well 53 while the remainder of the photoresist pattern 65 protects the second well 55 structures. The photoresist pattern 65 is then removed and the faceted epitaxial semiconductor structures are grown on the exposed semiconductor surfaces within the first well 53.

As discussed in some detail above, the epitaxial pattern 70$^1$, 70$^2$ may constitute only a single epitaxial semiconductor layer 67 or, in the alternative, may constitute a heterogeneous epitaxial semiconductor pattern that includes both a core layer 67 and a surface layer 69. Both the core layer and surface layer (if present) will tend to have a series of facets (67t, 67f$^4$ and 67f$^2$ on the core layer and 69t, 69f$^4$ and 69f$^2$ on the surface layer) As also discussed above, depending on the selection of the materials used to form the core and surface layers 67, 69 the upper or surface epitaxial layer 69 can be configured as a strained semiconductor layer under either tension or compression for further altering the mobility of carriers within the channel region.

As illustrated in FIG. 9C, the second isolation pattern 60b is then removed to expose the surface of the active area in the second transistor area B. As illustrated in FIG. 9C, a gate dielectric 71 is then formed on the exposed semiconductor surfaces of the second active area as well as the exposed surfaces of the faceted epitaxial semiconductor structure. A gate electrode stack layer 73 is then formed over the gate dielectric 71 in the first and second active areas 61a, 61b, patterned and etched to form a first gate pattern 73a and a second gate pattern 73b respectively. Additional processing including, for example, source/drain regions ion implantation, metallization, testing and packaging, will typically be performed to complete the semiconductor fabrication process and produce a useful semiconductor device.

Although the invention has been described in connection with certain exemplary embodiments, it will be evident to those of ordinary skill in the art that many alternatives, modifications, and variations may be made to the disclosed methods in a manner consistent with the detailed description provided above. Also, it will be apparent to those of ordinary skill in the art that certain aspects of the various disclosed exemplary embodiments could be used in combination with aspects of any of the other disclosed embodiments or their alternatives to produce additional, but not herein illustrated, embodiments incorporating the claimed invention but more closely adapted for an intended use or performance requirements. Accordingly, it is intended that all such alternatives, modifications and variations that fall within the spirit of the invention are encompassed within the scope of the appended claims.

We claim:

1. A semiconductor device comprising:
    a semiconductor substrate having a first active area and a second active area, wherein;
    the first active area includes
        a first primary semiconductor surface having a first crystal orientation,
        a first gate dielectric layer formed on the first primary surface, and
        a first gate electrode formed on the gate dielectric layer; and
    the second active area includes
        a second primary semiconductor surface having the first crystal orientation, wherein the second primary semiconductor surface is a virtual planar semiconductor surface and at the same level as the first primary semiconductor surface,
        a first faceted epitaxial semiconductor structure directly formed on the second primary semiconductor surface having at least one facet surface that has a second crystal orientation different from the first crystal orientation,
        a second gate dielectric layer formed on the facet surface, and
        a second gate electrode formed on the second gate dielectric layer.

2. The semiconductor device according to claim 1, wherein:
    the first faceted epitaxial semiconductor structure has a first pair of facet surfaces having the second crystal orientation and a first mirror crystal orientation and a second pair of facet surfaces having a third crystal orientation and a second mirror crystal orientation.

3. The semiconductor device according to claim 2, wherein:
the first pair of facet surfaces having (113) and (113) crystal orientations and the second pair of facet surfaces having (111) and (111) crystal orientations.

4. The semiconductor device according to claim 2, wherein: the first pair of facet surfaces have different crystal orientations selected from a family of equivalent {113} planes and the second pair of facet surfaces have different crystal orientations selected from a family of equivalent {111} planes.

5. The semiconductor device according to claim 1, wherein:
the first faceted epitaxial semiconductor structure has a top surface having the first crystal orientation arranged between a pair of facet surfaces that form obtuse angles with the top surface.

6. The semiconductor device according to claim 1, wherein:
the first faceted epitaxial semiconductor structure includes a core material and a surface layer.

7. The semiconductor device according to claim 6, wherein: the core material has a first lattice constant $L_C$ and a surface layer has a second lattice constant $L_S$.

8. The semiconductor device according to claim 7, wherein: the first and second lattice constants satisfy the expression $L_C > L_S$.

9. The semiconductor device according to claim 8, wherein:
the core material and surface layer are selected from a group consisting of Si, SiC, SiGe, Ge and combinations thereof.

10. The semiconductor device according to claim 7, wherein: the first and second lattice constants satisfy the expression $L_C < L_S$.

11. The semiconductor device according to claim 10, wherein: the core material and surface layer are selected from a group consisting of Si, SiC, SiGe, Ge and their composition.

12. The semiconductor device according to claim 1, wherein:
the first crystal orientation is (110);
a PMOS device is formed on the first active area; and
a NMOS device is formed on the second active area.

13. The semiconductor device according to claim 12, wherein:
a first facet surface has a different crystal orientation selected from a family of equivalent planes selected from a group consisting of the {100}, {111} and {113} families.

14. The semiconductor device according to claim 13, wherein:
the first facet surface has a crystal orientation selected from a group consisting of (100), (010), (113) and (111).

15. The semiconductor device according to claim 1, wherein:
the first crystal orientation is (100);
a NMOS device is formed on the first active area; and
a PMOS device is formed on the second active area.

16. The semiconductor device according to claim 15, wherein:
a first facet surface has a crystal orientation of (110).

17. The semiconductor device according to claim 1, further comprising:
a second faceted epitaxial semiconductor structures formed on the second primary semiconductor surface, including at least one facet surface that has the second crystal orientation, separated from the first faceted epitaxial semiconductor structure,
a third gate dielectric layer formed on the facet surface of the second faceted epitaxial semiconductor structure, and
a third gate electrode formed on the gate dielectric layer.

* * * * *